United States Patent
Kang et al.

(10) Patent No.: US 8,197,702 B2
(45) Date of Patent: Jun. 12, 2012

(54) MANUFACTURING METHOD OF PRINTED CIRCUIT BOARD

(75) Inventors: Myung-Sam Kang, Hwaseong-si (KR); Jung-Hyun Park, Daejeon (KR); Ji-Eun Kim, Gwangmyeong-si (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 391 days.

(21) Appl. No.: 12/508,224

(22) Filed: Jul. 23, 2009

(65) Prior Publication Data

US 2010/0132876 A1    Jun. 3, 2010

(30) Foreign Application Priority Data

Dec. 2, 2008 (KR) .................. 10-2008-0120966

(51) Int. Cl.
*C25D 5/02* (2006.01)
*B32B 37/00* (2006.01)
*B32B 38/00* (2006.01)
(52) U.S. Cl. ........... 216/18; 156/151; 156/230; 156/240
(58) Field of Classification Search .................. None
See application file for complete search history.

(56) References Cited

U.S. PATENT DOCUMENTS

| | | | | |
|---|---|---|---|---|
| 6,958,535 B2 * | 10/2005 | Hirano et al. | ................. | 257/707 |
| 7,537,668 B2 * | 5/2009 | Watanabe | ................ | 156/257 |
| 2002/0096759 A1 * | 7/2002 | Hirano et al. | ................. | 257/706 |
| 2006/0016553 A1 * | 1/2006 | Watanabe | ................. | 156/272.2 |
| 2008/0251494 A1 * | 10/2008 | Park et al. | ................ | 216/13 |
| 2008/0264684 A1 * | 10/2008 | Kang et al. | ................ | 174/262 |
| 2009/0014411 A1 * | 1/2009 | Watanabe | ................ | 216/18 |
| 2009/0083976 A1 * | 4/2009 | Lee | ................. | 29/846 |
| 2011/0061912 A1 * | 3/2011 | Kang et al. | ................ | 174/258 |
| 2011/0088930 A1 * | 4/2011 | Lee | ................ | 174/256 |
| 2011/0100698 A1 * | 5/2011 | Naganuma | ................ | 174/264 |

FOREIGN PATENT DOCUMENTS

KR    10-2008-0096985 A    11/2008

OTHER PUBLICATIONS

Korean Office Action issued in Korean Patent Application No. KR 10-2008-0120966 dated Aug. 17, 2010.

* cited by examiner

*Primary Examiner* — Allan Olsen
(74) *Attorney, Agent, or Firm* — McDermott Will & Emery LLP

(57) ABSTRACT

Disclosed is a method of manufacturing a printed circuit board. The method of manufacturing a printed circuit board having a via for interlayer connection can include forming a circuit pattern on one side of a carrier, pressing one side of the carrier into one side of the insulator, removing the carrier, forming a hole penetrating through the insulator by processing one end of the circuit pattern, and forming a conductive material inside the hole to have the conductive material correspond to the via.

5 Claims, 25 Drawing Sheets

MANUFACTURING METHOD OF PRINTED CIRCUIT BOARD

CROSS-REFERENCE TO RELATED APPLICATIONS

This application claims the benefit of Korean Patent Application No. 10-2008-0120966, filed with the Korean Intellectual Property Office on Dec. 2, 2008, the disclosure of which is incorporated herein by reference in its entirety.

BACKGROUND

1. Technical Field

The present invention relates to a method of manufacturing a printed circuit board.

2. Description of the Related Art

With the development of the electronics industry, there has been a growing demand for smaller electronic parts and more advanced functions. Such a trend requires that circuit patterns be implemented in higher densities in the printed circuit board, and accordingly various methods of forming fine circuit patterns have been developed.

For example, a conventional structure, in which circuit patterns are formed on the surfaces of an insulator, can create several problems when it is applied to a high density circuit (e.g. 20/20 μm or less), and thus a structure has been proposed as an alternative, in which the circuit patterns are buried inside the insulator. To implement this structure, a method of forming circuits has been developed that includes forming a circuit pattern on a carrier and then pressing the carrier onto the insulator, to transcribe the circuit pattern into the insulator.

However, various problems may occur when using this method. For example, in the operation of processing a via hole using a laser drill, etc., to form a via for interlayer connection, the use of excessive energy can result in holes that deviate from the desired shape. These problems are regarded as obstacles to realizing the structural benefits intended from the structure of buried circuit patterns.

FIG. 1 through FIG. 7 each illustrates a process in a method of manufacturing a printed circuit board according to the related art. In this method, as illustrated in FIG. 1 through FIG. 7, holes 3 can be formed by laser-processing a copper clad laminate, which includes copper foils 2 attached to both sides of an insulator, after which seed layers 4 can be formed by performing electroless copper plating over the inner walls of the holes 3. Then, plating resists 5 can be formed, by applying, exposing, and developing dry films, and circuit patterns 7 can be formed, using electroplating. Afterwards, the plating resists 5 can be removed, and the seed layers 4 and the copper foils 2 can be etched.

This method based on the related art can lead to deviations in thickness after the copper electroplating is performed to form circuit patterns. In addition, the process of etching the seed layers may further increase the deviations in circuit-line thickness and circuit pitch, due to over-etching, etc.

SUMMARY

The present invention provides a method of manufacturing a printed circuit board, in which the lands are removed for increased wiring density.

An aspect of present invention provides a method of manufacturing a printed circuit board that includes a via for interlayer connection. The method includes forming a circuit pattern on one side of a carrier, pressing one side of the carrier into one side of an insulator, removing the carrier, forming a hole penetrating through the insulator by processing one end of the circuit pattern, and forming a conductive material inside the hole to have the conductive material correspond to the via.

In certain embodiments, there may be no via land formed on the end of the circuit pattern.

The carrier can be made of a metal material, while the forming of the circuit pattern can include forming a barrier on one side of the carrier that is made of a different material from that of the carrier, and forming the circuit pattern on the barrier. Here, the method can further include forming a first seed layer on the barrier that is made of a different material from that of the barrier. The circuit pattern can be formed on the first seed layer by electroplating.

The conductive material can be formed inside the hole by forming a second seed layer on an inner wall of the hole and a surface of the barrier, forming a conductive material inside the hole and on the barrier by electroplating, removing the conductive material formed on the barrier, and removing the barrier.

The operation of forming the conductive material can be performed such that the conductive material fills the hole.

DETAIL DESCRIPTION

Figure 1:
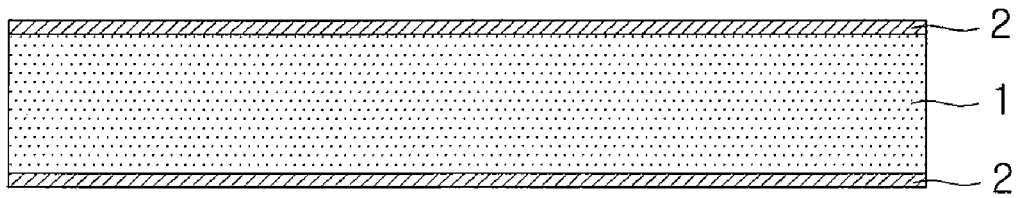
FIG. 1 through FIG. 7 each illustrates a process in a method of manufacturing a printed circuit board according to the related art.
Figure 2:
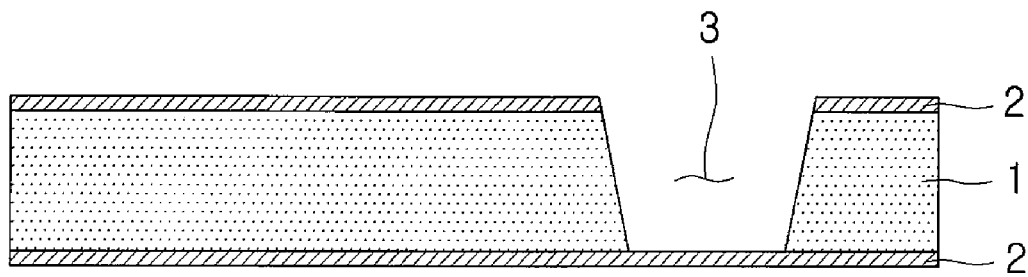
Figure 3:
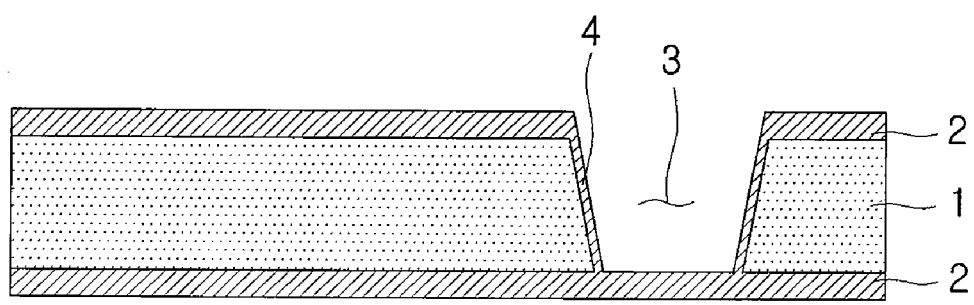
Figure 4:
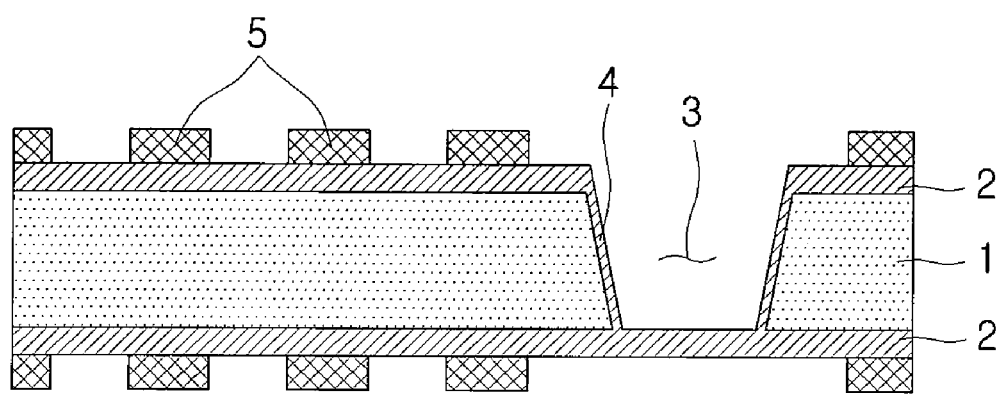
Figure 5:
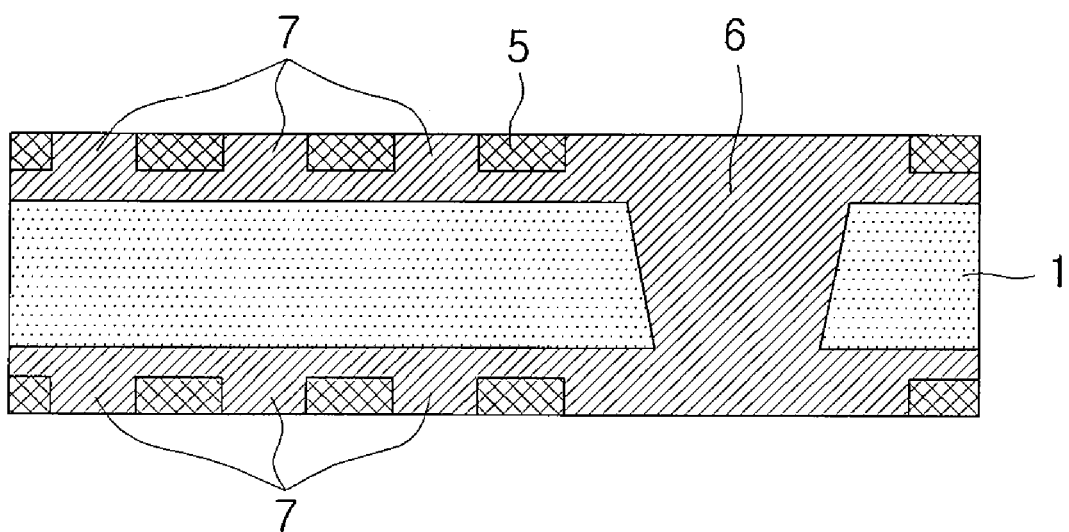
Figure 6:
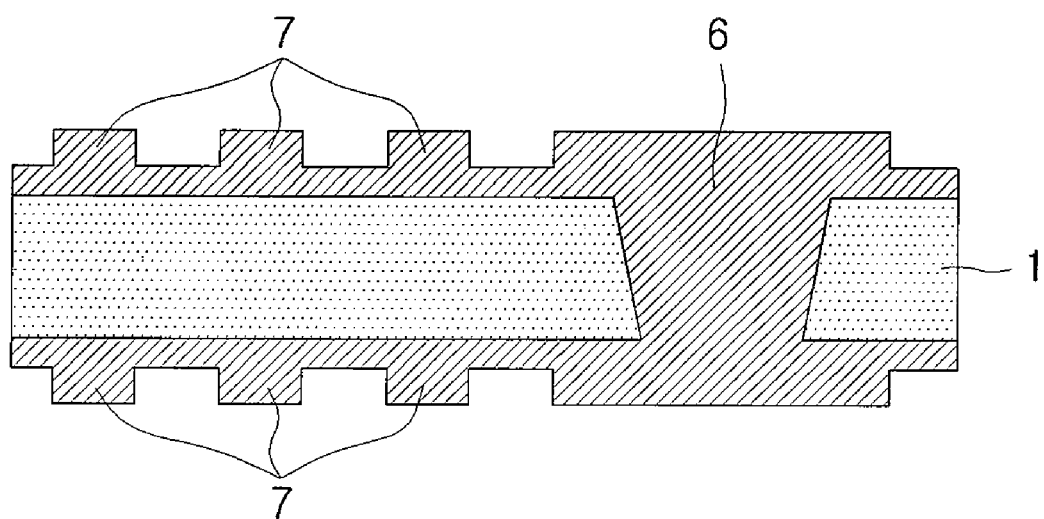
Figure 7:
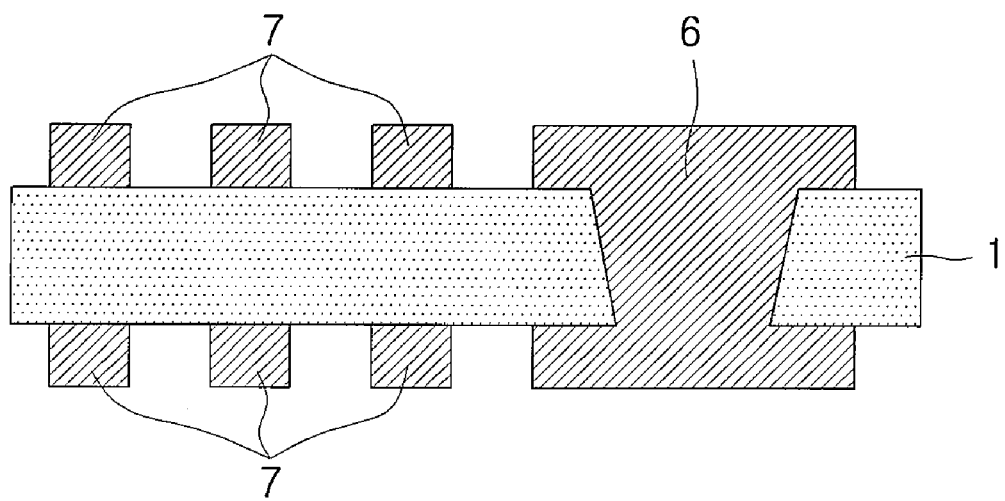

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention.

While such terms as "first" and "second," etc., may be used to describe various components, such components must not be limited to the above terms. The above terms are used only to distinguish one component from another.

A method of manufacturing a printed circuit board according to certain embodiments of the present invention will be described below in more detail with reference to the accompanying drawings. Identical or corresponding elements will be given the same reference numerals, regardless of the figure number, and any redundant description of the identical or corresponding elements will not be repeated.

Figure 8:
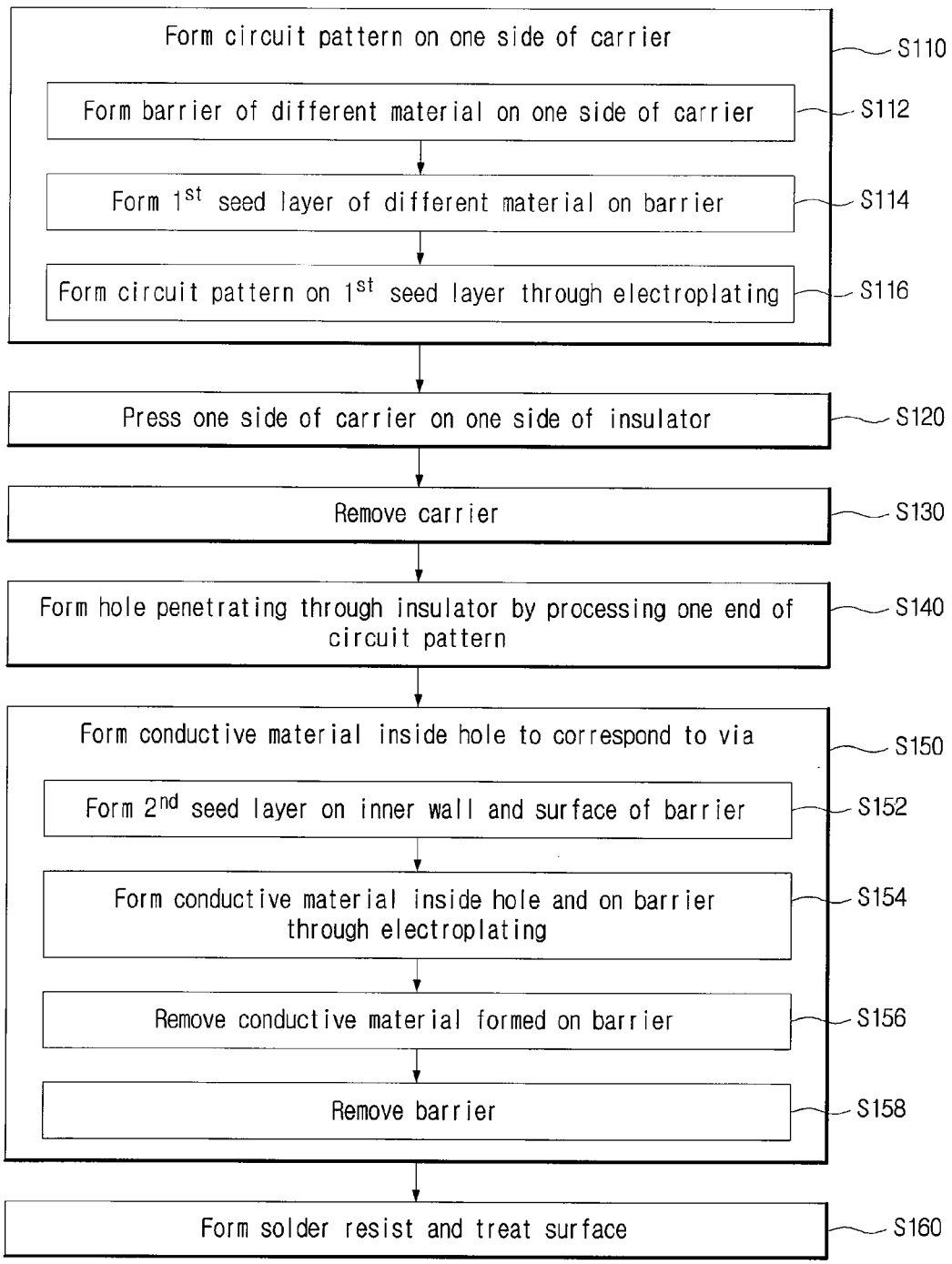
FIG. 8 is a flowchart illustrating a method of manufacturing a printed circuit board according to an embodiment of the present invention.

FIG. 8 is a flow chart representing a method of manufacturing a printed circuit board according to an embodiment of the present invention, and FIG. 9 through FIG. 25 each illustrates a process in a method of manufacturing a printed circuit board according to an embodiment of the present invention. In FIG. 9 through FIG. 22, a carrier 10, a barrier 12, a first seed layer 14, a plating resist 16, a circuit pattern 18, an insulator 20, a hole 30, a second seed layer 40, conductive layers 42 and 44, and a solder resist 50 are shown.

First, a circuit pattern 18 can be formed on one side of a carrier 10 (Operation S110). The circuit pattern 18 formed on one side of the carrier 10 can be moved by the carrier 10 and buried in the insulator 20 later. A method of forming the circuit pattern 18 on the carrier 10 will be briefly described as follows.

Figure 9:
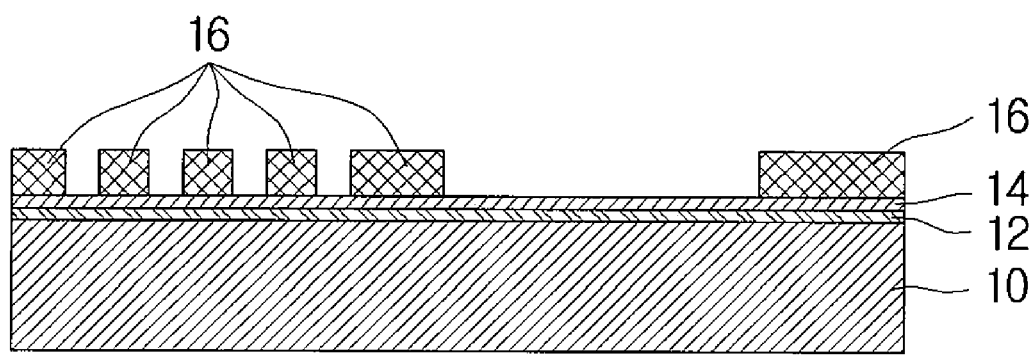
FIG. 9 through FIG. 25 each illustrates a process in a method of manufacturing a printed circuit board according to an embodiment of the present invention.

As illustrated in FIG. 9, a barrier 12 can be formed on one side of the carrier 10 (Operation S112). The barrier 12 can be formed on the carrier 10 using a plating method, or by pressing a thin-film material onto the carrier 10.

The barrier 12 can be made of a material that is different from that of the carrier 10. In particular, the barrier 12 can be made of a material that is not reactive to the etchant that will be applied to the carrier 10. For example, if the carrier 10 is made of copper, the barrier 12 can be made of a material such as nickel, chrome, or aluminum. In this way, the barrier 12 may function as an etch-stop.

Then, as shown in FIG. 9, the first seed layer 14 can be formed on the barrier 12 (Operation S114). The first seed layer 14 can be made of a material that is different from that of the barrier 12, more particularly a material that is not reactive to the etchant that will be applied to the carrier 10. For example, if the barrier 14 is made of nickel, chrome, or aluminum, the first seed layer 14 can be made of copper. Electroless copper plating, for example, can be used to form the copper material first seed layer 14.

Figure 10:
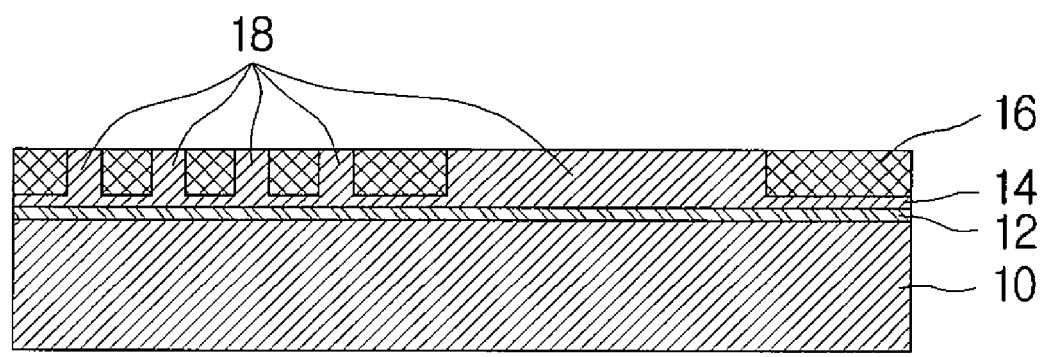
Figure 11:
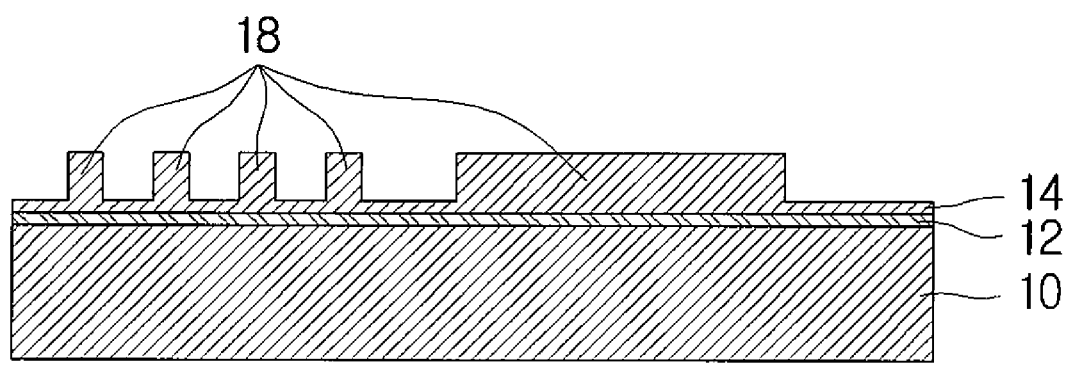

Thereafter, a circuit pattern 18 can be formed on the first seed layer 14 by performing the electroplating using the plating resists 16 (Operation S116). In particular, the patterned plating resist 16 can be formed on a surface of the first seed layer 14 as shown in FIG. 9, and then the circuit pattern 18 can be formed by performing the electroplating as shown in FIG. 10 and then removing the plating resist 16 as shown in FIG. 11. As such, when the circuit pattern 18 is formed by using the electroplating, a fine pitch can be made between the patterns, thereby effectively forming a high density circuit.

Figure 12:
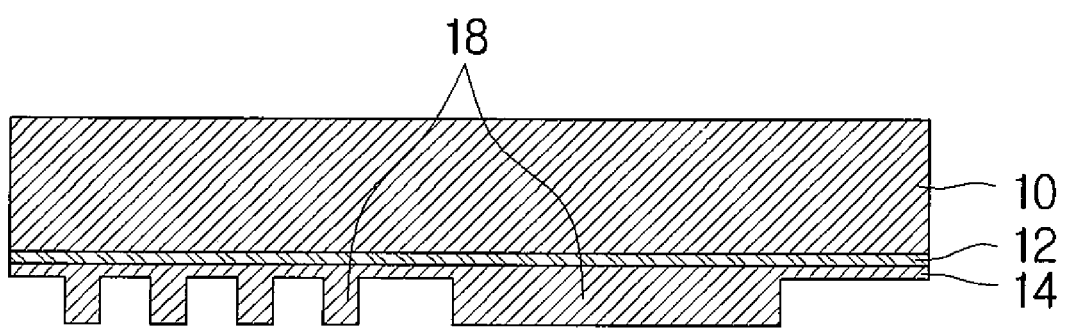
Figure 12:
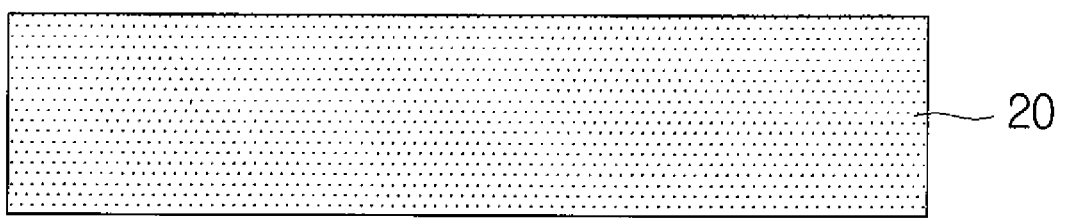
Figure 12:
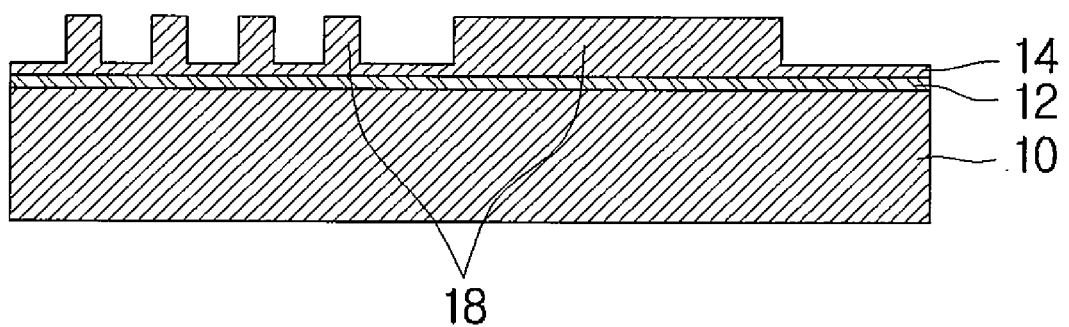
Figure 13:
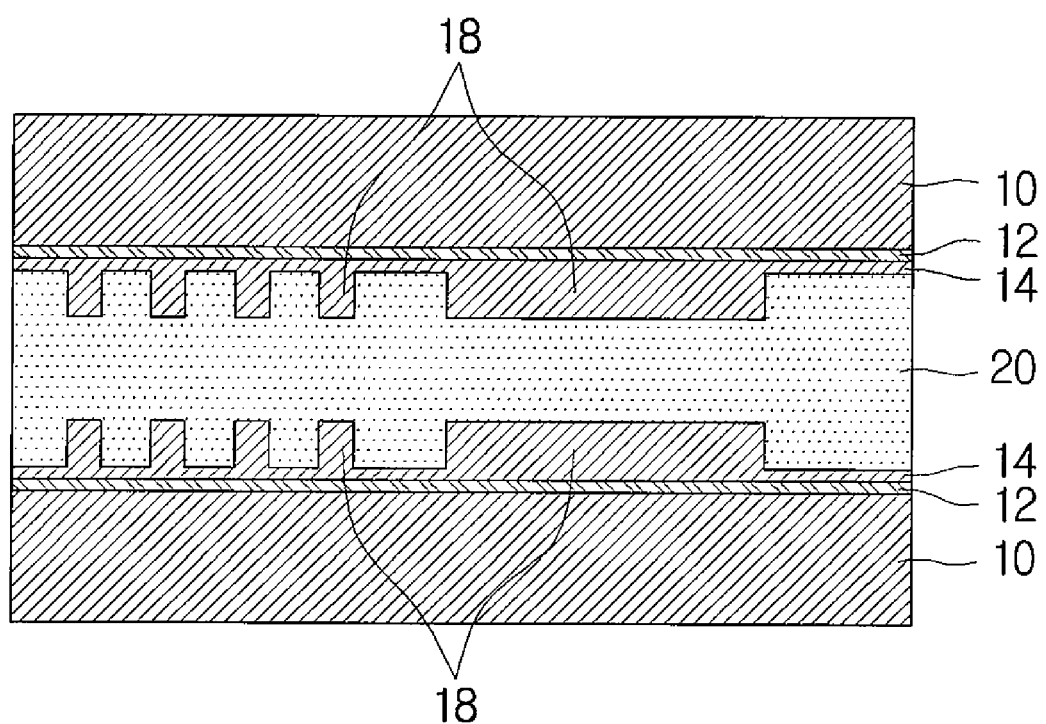
Figure 14:
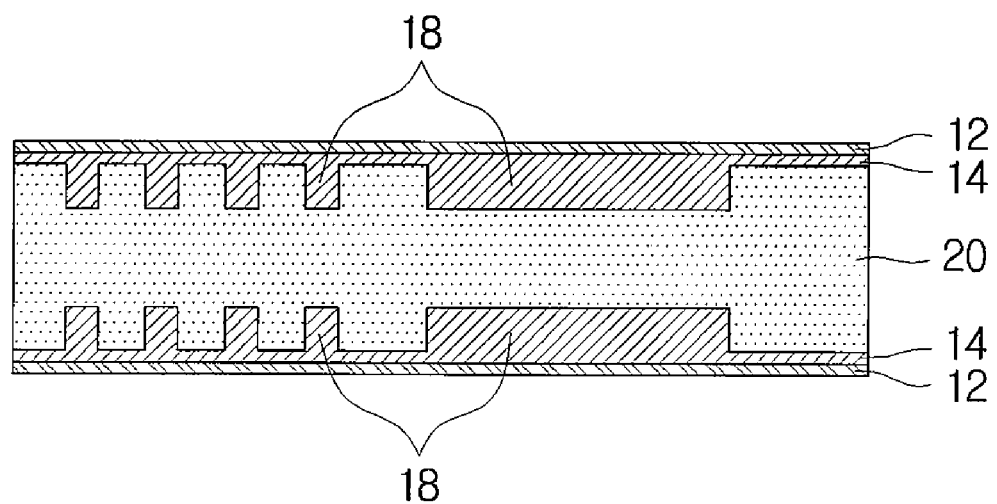

After the circuit pattern 18 is formed through the above processes, one side of the carrier 10 can be pressed toward one side of the insulator 20 (Operation SI 20), and then the carrier 10 can be removed (Operation S130). In particular, the carrier 10 and the insulator 20 can be aligned as shown in FIG. 12, and then the carrier 10 and the insulator 20 can be compressed to allow the circuit pattern 18 to be buried in the insulator 20 as shown in FIG. 13. Thereafter, the carrier 10 can be removed as shown in FIG. 14.

Although the carrier 10 can be removed by mechanical polishing, a chemical method using an etchant is suggested in the present embodiment. If the etching is performed on the carrier 10, which is made of copper or the like, by using an etchant while the barrier 12, which is made of nickel, chrome or the like, is placed underneath, the etchant has no effect on the barrier 12, which thereby can function as an etch-stop, efficiently controlling the depth of etching.

Figure 15:
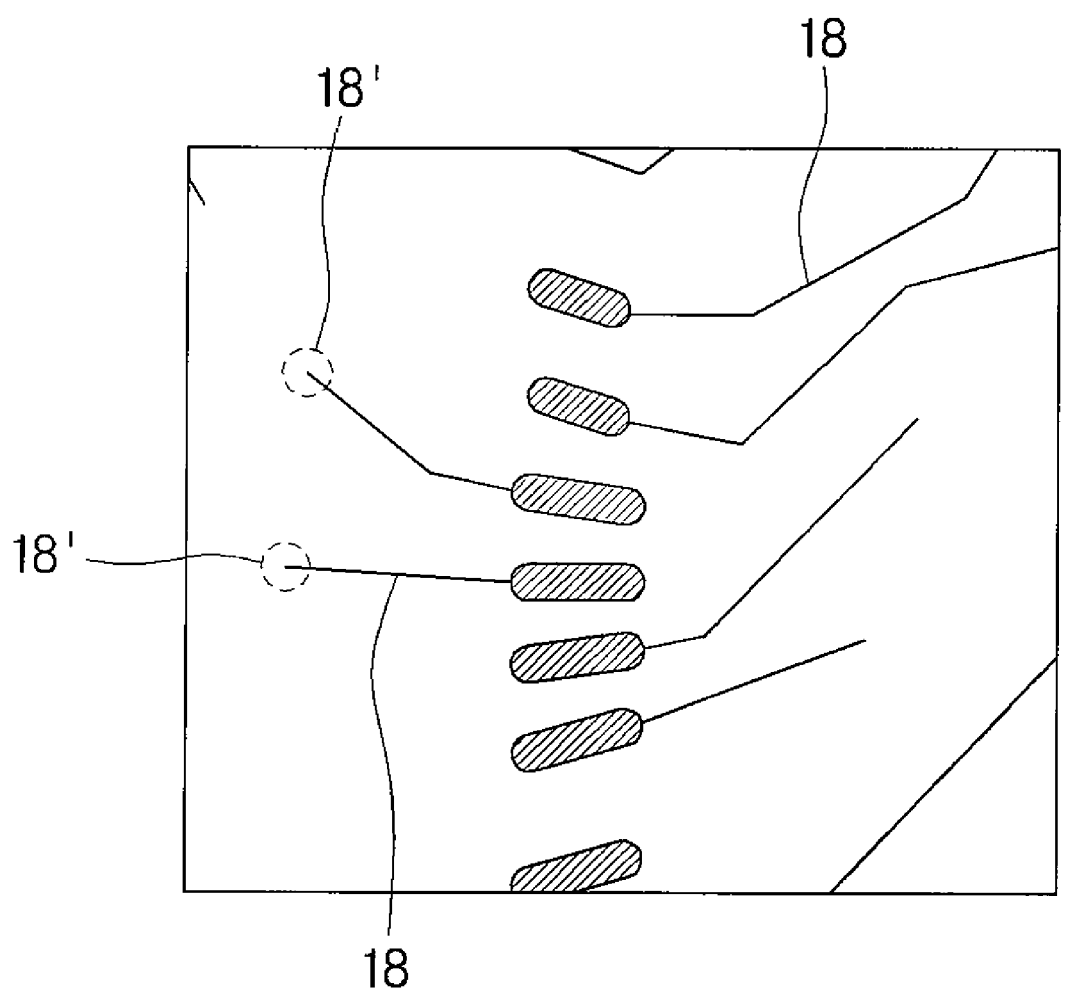
Figure 16:
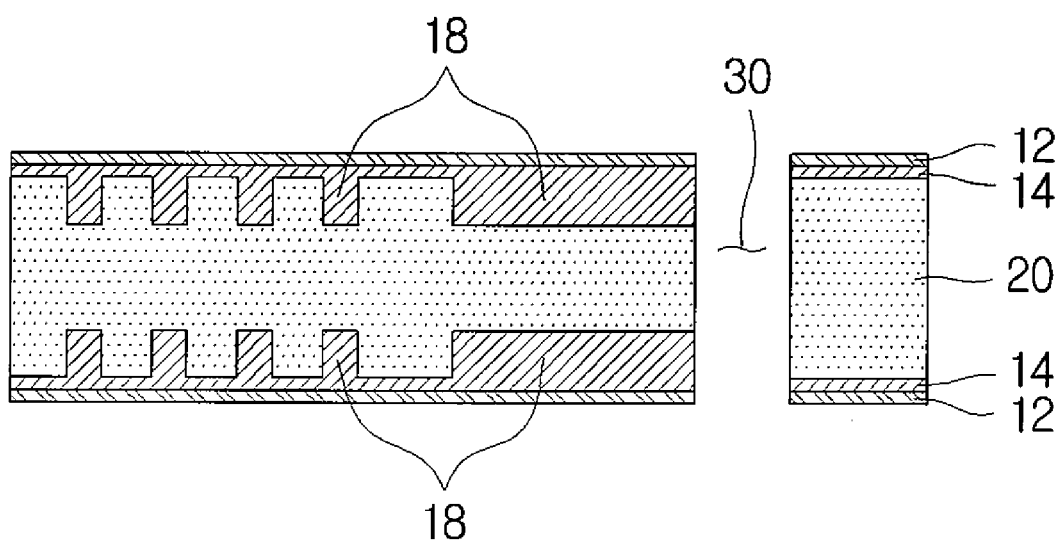

Then, as shown in FIG. 16, the hole 30 penetrating through the insulator 20 can be formed by processing one end 18' of the circuit pattern 18 (Operation S140). At this time, no via land may be formed on one end 18' of the circuit pattern 18, in which the hole 30 is processed. That is, as shown in FIG. 15, the hole 30 can be formed by processing one end 18' of the circuit pattern 18, in which no via land is formed.

Figure 17:
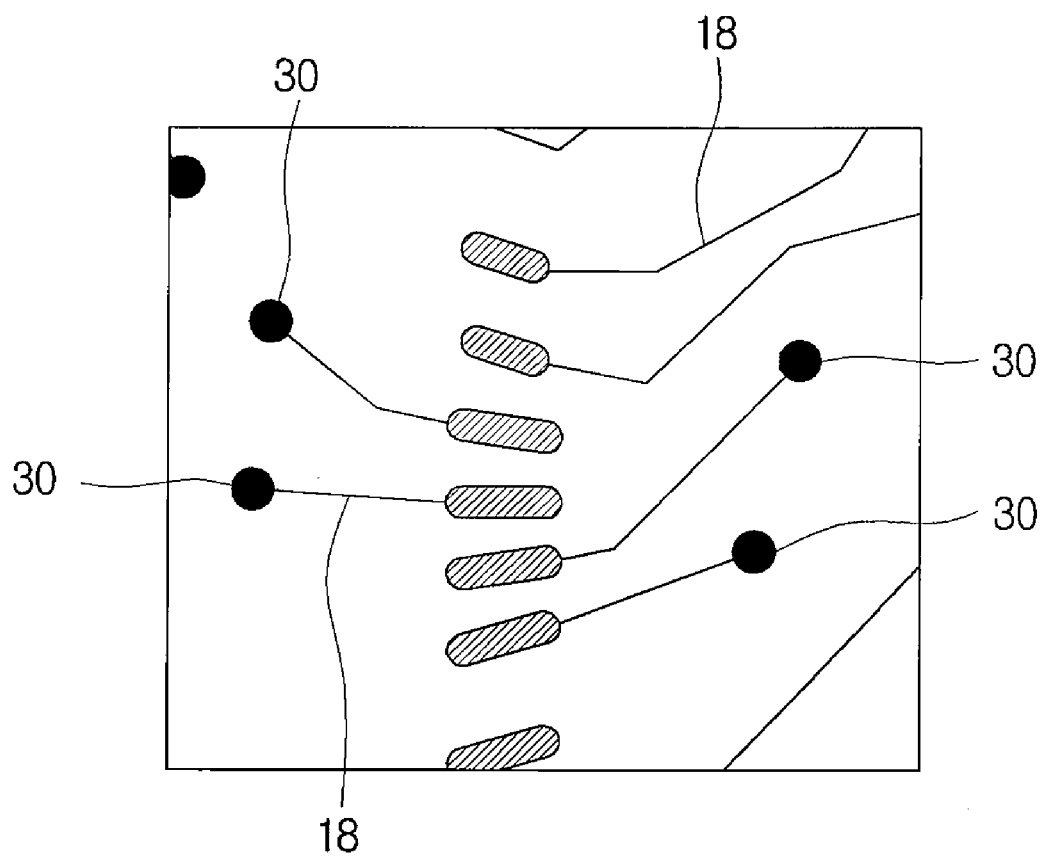

If a via is formed by processing one end 18' of the circuit pattern 18, in which no via land is formed, a landless via structure can be realized, thereby easily forming a high density circuit pattern 18. A mechanical drill can be used to form the hole 30. The processed hole 30 can have a circular shape, of which the center is one end 18' of the circuit pattern 18, as shown in FIG. 17.

After the hole 30 is processed as described above, a conductive material can be formed inside the hole 30, to correspond to the via (Operation S150). This will be described below in more detail.

Figure 18:
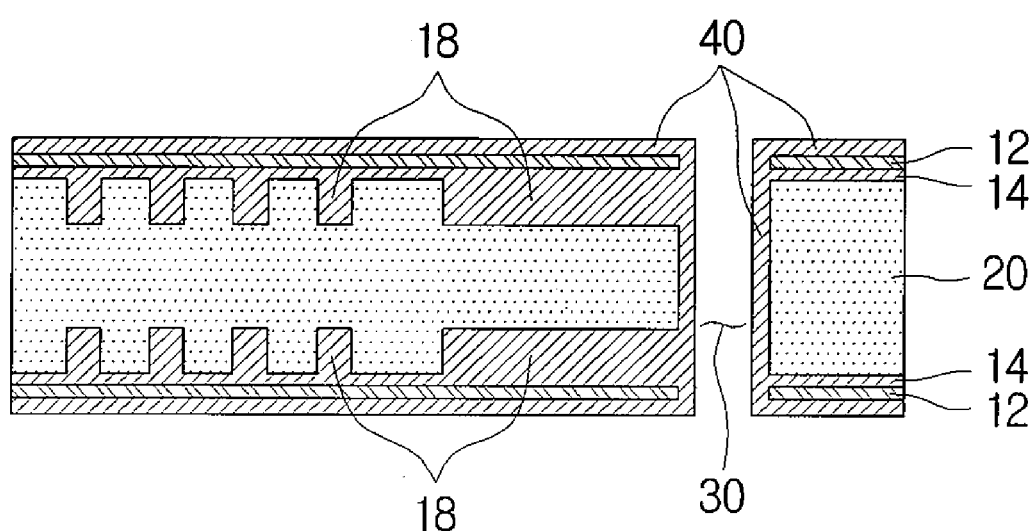

First, the second seed layer 40 can be formed on an inner wall of the hole 30 and a surface of the barrier 12 (Operation S152; refer to FIG. 18). It is possible to use, for example, electroless copper plating to form the second seed layer 40.

Figure 19:
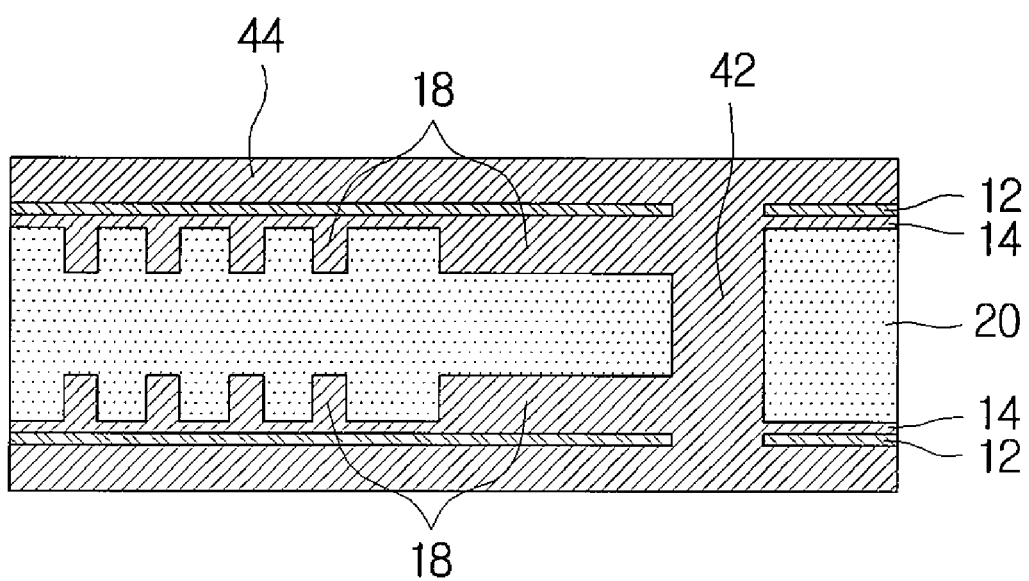

After the second seed layer 40 is formed, conductive materials 42 and 44 can be formed inside the hole 30 and on the barrier 12, respectively, through electroplating (Operation S154; refer to FIG. 19). At this time, this process can be performed to fill the conductive material 42, such as copper, inside the hole 30. That is, the electroplating can be performed until the conductive material 42 is completely filled inside the hole 30. Since the conductive material 42 to be formed inside the hole 30 will function as a via for electrically connecting one layer to another layer later, it becomes possible to form a structure that can acquire reliability in electrically connecting one layer to another layer by completely filling the conductive material 42 inside of the previously formed via hole 30.

Figure 20:
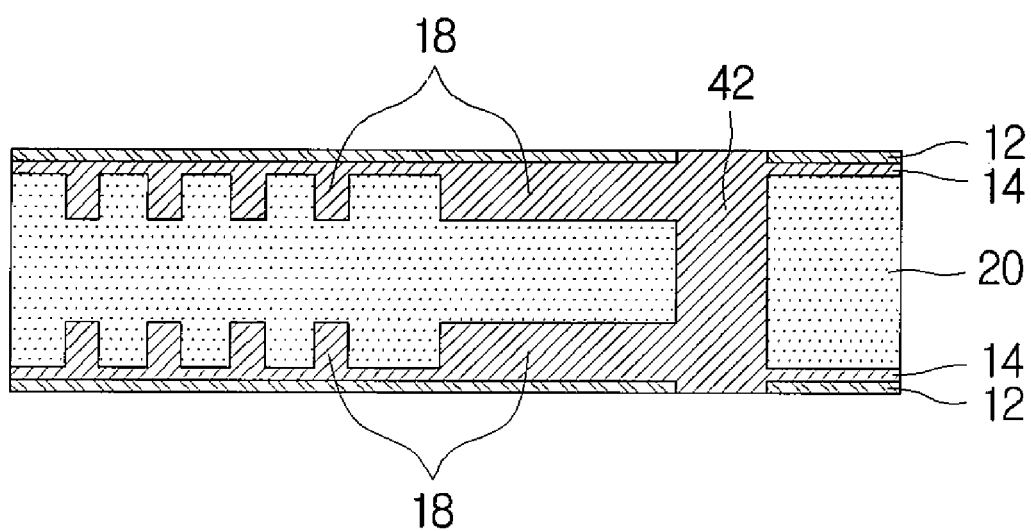

Then, the conductive material 44 formed on the barrier 12 can be removed (Operation S156; refer to FIG. 20). The present embodiment suggests a chemical method using an etchant to remove the conductive material 44 formed on the barrier 12. If the etching is performed on the conductive material 44, such as copper, by using an etchant while the barrier 12 made of a material such as nickel or chrome is placed underneath, the etchant has no effect on the barrier 12, and thus the barrier 12 can function as an etch-stop to thereby efficiently control the depth of etching.

Figure 21:
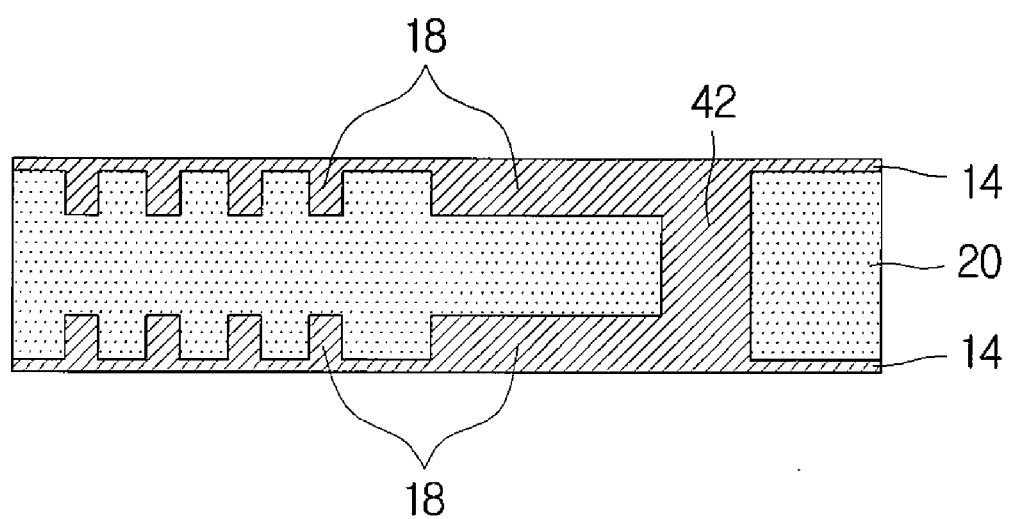
Figure 22:
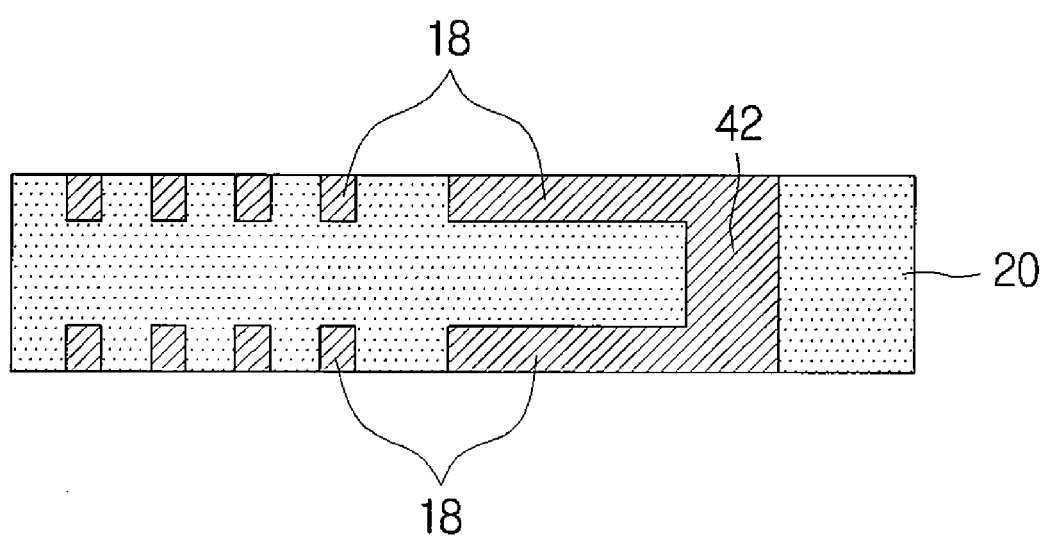

Then, the barrier 12 can be removed (Operation S158; refer to FIG. 21). To remove the barrier 12, the chemical method using an etchant can be also used. Since the barrier 12 and the seed layer 14 placed underneath the barrier 12 react differently with the etchant, the barrier 12 can be removed efficiently without affecting the seed layer 14.

Figure 23:
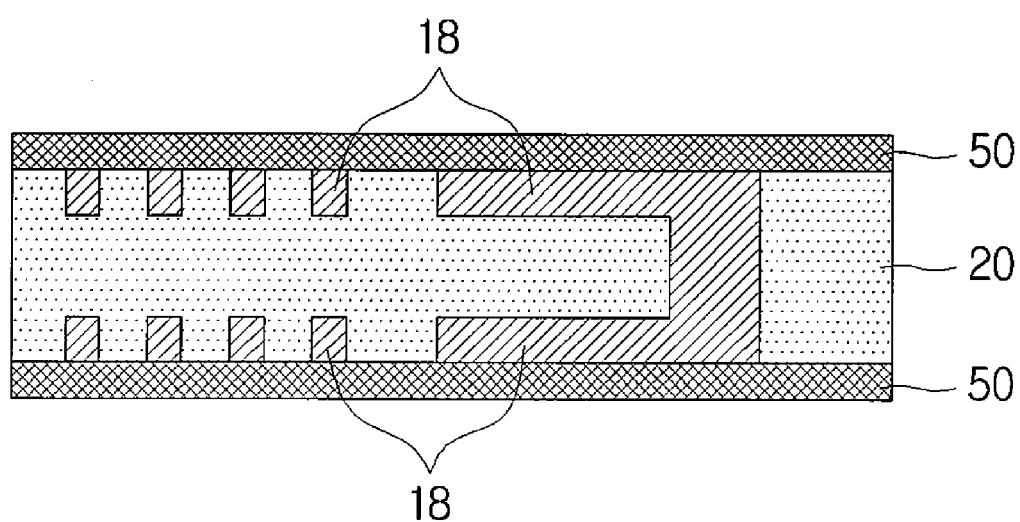

Next, the first seed layer 14 can be removed through, for example, flash etching (Operation S160; refer to FIG. 22), and then the solder resist 50 can be formed on a top layer and a desired part can be surface-treated (refer to FIG. 23).

Figure 24:
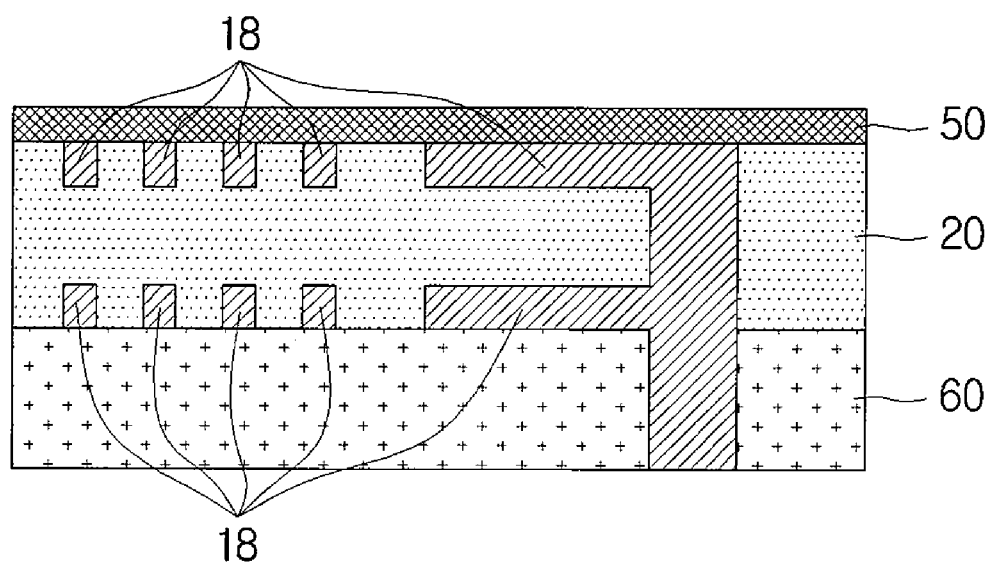
Figure 25:
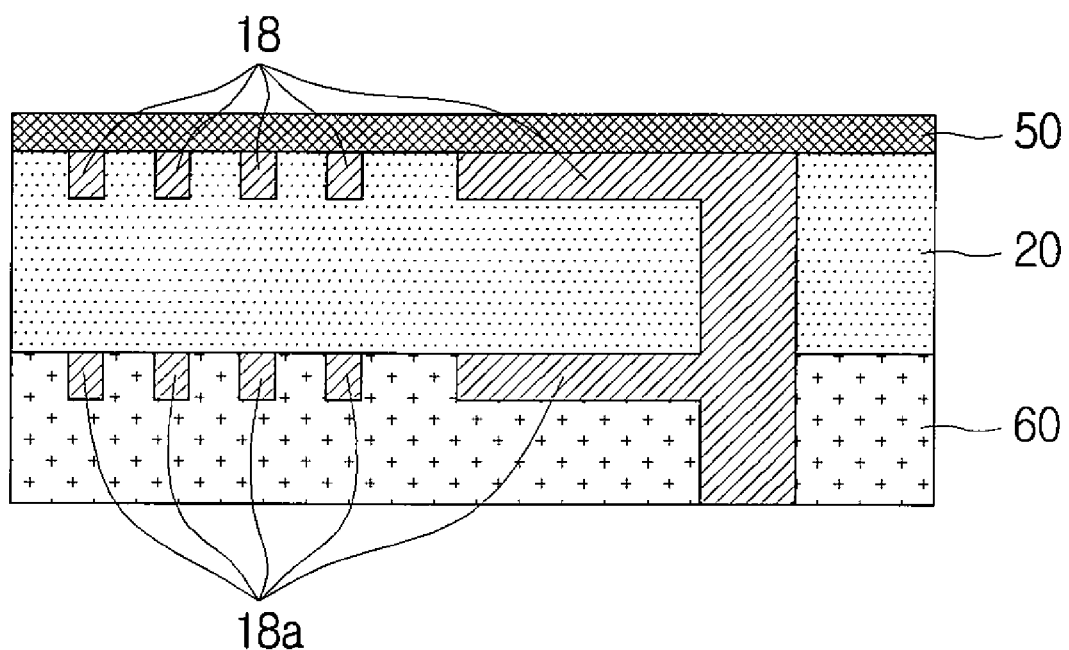

Although manufacturing of a double-sided substrate has been described with reference to FIG. 9 through FIG. 22, it shall be evident that a multi-layered printed circuit board can be manufactured by additionally stacking the insulator 20 on an additional inner substrate 60, as shown in FIGS. 24 and 25. In this case, while the circuit pattern 18 can be completely buried in the insulator 20 (refer to FIG. 24), some circuit pattern 18' may be buried in the insulator 20, and the other circuit pattern 18*a* may be buried in the inner substrate 60 (refer to FIG. 25).

Hitherto, although some embodiments of the present invention have been shown and described, it shall be appreciated by any person of ordinary skill in the art that a large number of modifications, permutations and additions are possible within the principles and spirit of the invention, the scope of which shall be defined by the appended claims and their equivalents.

Many other embodiments can be included in the scope of claims of the present invention.

What is claimed is:

1. A method of manufacturing a printed circuit board having a via for interlayer connection, the method comprising:
   forming a circuit pattern on one side of a carrier;
   pressing one side of the carrier into one side of an insulator;
   removing the carrier;

forming a hole penetrating through the insulator by processing one end of the circuit pattern, wherein no via land is formed on the one end of the circuit pattern; and forming a landless via structure by forming a conductive material inside the hole.

2. The method of claim 1, wherein the forming of the conductive material is performed such that the conductive material fills the hole.

3. The method of claim 1, wherein the carrier is made of a metal material, and the forming of the circuit pattern comprises:

forming a barrier on one side of the carrier, the barrier made of a different material from that of the carrier; and forming the circuit pattern on the barrier.

4. The method of claim 3, further comprising forming a first seed layer on the barrier, the first seed layer made of a different material from that of the barrier, wherein the circuit pattern is formed on the first seed layer by electroplating.

5. The method of claim 3, wherein the forming of the conductive material inside the hole comprises:

forming a second seed layer on an inner wall of the hole and a surface of the barrier;

forming a conductive material inside the hole and on the barrier by electroplating;

removing the conductive material formed on the barrier; and removing the barrier.

* * * * *